United States Patent
Mohseni (10) Patent No.: US 11,237,225 B2
(45) Date of Patent: Feb. 1, 2022

(54) DYNAMIC MAGNETIC SHIELDING AND BEAMFORMING USING FERROFLUID FOR COMPACT MAGNETOENCEPHALOGRAPHY (MEG)

(71) Applicant: HI LLC, Los Angeles, CA (US)

(72) Inventor: Hooman Mohseni, Wilmette, IL (US)

(73) Assignee: HI LLC, Los Angeles, CA (US)

( * ) Notice: Subject to any disclaimer, the term of this patent is extended or adjusted under 35 U.S.C. 154(b) by 249 days.

(21) Appl. No.: 16/456,975

(22) Filed: Jun. 28, 2019

(65) Prior Publication Data
US 2020/0088811 A1    Mar. 19, 2020

Related U.S. Application Data (60) Provisional application No. 62/732,791, filed on Sep. 18, 2018.

(51) Int. Cl.
*G01R 33/035* (2006.01)
*G01R 33/26* (2006.01)
*G01R 33/032* (2006.01)

(52) U.S. Cl.
CPC ....... *G01R 33/0356* (2013.01); *G01R 33/032* (2013.01); *G01R 33/26* (2013.01)

(58) Field of Classification Search
CPC .. G01R 33/0356; G01R 33/032; G01R 33/26; G01R 33/00
See application file for complete search history.

(56) References Cited

U.S. PATENT DOCUMENTS

| | | |
|---|---|---|
| 3,173,082 A | 3/1965 | Bell et al. |
| 3,257,608 A | 6/1966 | Bell et al. |
| 3,495,161 A | 2/1970 | Bell |
| 3,501,689 A | 3/1970 | Robbiano |
| 3,513,381 A | 5/1970 | Happer, Jr. |
| 4,193,029 A | 3/1980 | Cioccio et al. |
| 4,951,674 A | 8/1990 | Zanakis et al. |

(Continued)

FOREIGN PATENT DOCUMENTS

| | | |
|---|---|---|
| CN | 104730484 | 6/2015 |
| CN | 106073751 | 11/2016 |

(Continued)

OTHER PUBLICATIONS

Tierney, T. M., Holmes, N., Meyer, S. S., Boto, E., Roberts, G., Leggett, J., . . . Barnes, G. R. (2018). Cognitive neuroscience using wearable magnetometer arrays: Non-invasive assessment of language function. NeuroImage, 181, 513-520.

(Continued)

*Primary Examiner* — Christopher P McAndrew
*Assistant Examiner* — Zannatul Ferdous
(74) *Attorney, Agent, or Firm* — Branch Partners PLLC; Bruce E. Black (57) ABSTRACT

A magnetic field measurement system can include at least one magnetometer; and a ferrofluid shield disposed at least partially around the at least one magnetometer. For example, the ferrofluid shield can include a microfluid fabric and a ferrofluid disposed in or flowable into the microfluid fabric. As another example, the ferrofluid shield can include a ferrofluid and a controller configured to alter an arrangement of the ferrofluid within the ferrofluid shield.

20 Claims, 4 Drawing Sheets

(56) References Cited

U.S. PATENT DOCUMENTS

| | | |
|---|---|---|
| 5,189,368 A | 2/1993 | Chase |
| 5,192,921 A | 3/1993 | Chantry et al. |
| 5,225,778 A | 7/1993 | Chaillout et al. |
| 5,254,947 A | 10/1993 | Chaillout et al. |
| 5,309,095 A | 5/1994 | Ahonen et al. |
| 5,442,289 A | 8/1995 | DiIorio et al. |
| 5,444,372 A | 8/1995 | Wikswo, Jr. et al. |
| 5,471,985 A | 12/1995 | Warden |
| 5,506,200 A | 4/1996 | Hirschkoff et al. |
| 5,526,811 A | 6/1996 | Lypchuk |
| 5,713,354 A | 2/1998 | Warden |
| 6,144,872 A | 11/2000 | Graetz |
| 6,339,328 B1 | 1/2002 | Keene et al. |
| 6,472,869 B1 | 10/2002 | Upschulte et al. |
| 6,665,553 B2 | 12/2003 | Kandori et al. |
| 6,806,784 B2 | 10/2004 | Hollberg et al. |
| 6,831,522 B2 | 12/2004 | Kitching et al. |
| 7,038,450 B2 | 5/2006 | Romalis et al. |
| 7,102,451 B2 | 9/2006 | Happer et al. |
| 7,145,333 B2 | 12/2006 | Romalis et al. |
| 7,521,928 B2 | 4/2009 | Romalis et al. |
| 7,656,154 B2 | 2/2010 | Kawabata et al. |
| 7,826,065 B1 | 11/2010 | Okandan et al. |
| 7,872,473 B2 | 1/2011 | Kitching et al. |
| 7,994,783 B2 | 8/2011 | Ledbetter et al. |
| 8,054,074 B2 | 11/2011 | Ichihara et al. |
| 8,212,556 B1 | 7/2012 | Schwindt et al. |
| 8,258,884 B2 | 9/2012 | Borwick, III et al. |
| 8,319,156 B2 | 11/2012 | Borwick, III et al. |
| 8,334,690 B2 | 12/2012 | Kitching et al. |
| 8,373,413 B2 | 2/2013 | Sugioka |
| 8,405,389 B2 | 3/2013 | Sugioka et al. |
| 8,587,304 B2 | 11/2013 | Budker et al. |
| 8,836,327 B2 | 9/2014 | French et al. |
| 8,906,470 B2 | 12/2014 | Overstolz et al. |
| 8,941,377 B2 | 1/2015 | Mizutani et al. |
| 9,084,549 B2 | 7/2015 | Desain et al. |
| 9,095,266 B1 | 8/2015 | Fu |
| 9,116,201 B2 | 8/2015 | Shah et al. |
| 9,140,590 B2 | 9/2015 | Waters et al. |
| 9,140,657 B2 | 9/2015 | Ledbetter et al. |
| 9,169,974 B2 | 10/2015 | Parsa et al. |
| 9,244,137 B2 | 1/2016 | Kobayashi et al. |
| 9,291,508 B1 | 3/2016 | Biedermann et al. |
| 9,343,447 B2 | 3/2016 | Parsa et al. |
| 9,366,735 B2 | 6/2016 | Kawabata et al. |
| 9,383,419 B2 | 7/2016 | Mizutani et al. |
| 9,395,425 B2 | 7/2016 | Diamond et al. |
| 9,417,293 B2 | 8/2016 | Schaffer et al. |
| 9,429,918 B2 | 8/2016 | Parsa et al. |
| 9,568,565 B2 | 2/2017 | Parsa et al. |
| 9,575,144 B2 | 2/2017 | Kornack et al. |
| 9,601,225 B2 | 3/2017 | Parsa et al. |
| 9,638,768 B2 | 5/2017 | Foley et al. |
| 9,639,062 B2 | 5/2017 | Dyer et al. |
| 9,677,905 B2 | 6/2017 | Waters et al. |
| 9,726,626 B2 | 8/2017 | Smith et al. |
| 9,726,733 B2 | 8/2017 | Smith et al. |
| 9,791,536 B1 | 10/2017 | Alem et al. |
| 9,829,544 B2 | 11/2017 | Bulatowicz |
| 9,846,054 B2 | 12/2017 | Waters et al. |
| 9,851,418 B2 | 12/2017 | Wolf et al. |
| 9,869,731 B1 | 1/2018 | Hovde et al. |
| 9,915,711 B2 | 3/2018 | Kornack et al. |
| 9,927,501 B2 | 3/2018 | Kim et al. |
| 9,948,314 B2 | 4/2018 | Dyer et al. |
| 9,964,609 B2 | 5/2018 | Ichihara et al. |
| 9,964,610 B2 | 5/2018 | Shah et al. |
| 9,970,999 B2 | 5/2018 | Larsen et al. |
| 9,995,800 B1 | 6/2018 | Schwindt et al. |
| 10,024,929 B2 | 7/2018 | Parsa et al. |
| 10,088,535 B1 | 10/2018 | Shah |
| 10,162,016 B2 | 12/2018 | Gabrys et al. |
| 10,194,865 B2 | 2/2019 | Le et al. |
| 10,314,508 B2 | 6/2019 | Desain et al. |
| 10,371,764 B2 | 8/2019 | Morales et al. |
| 10,772,561 B2 | 9/2020 | Donaldson |
| 2004/0232912 A1 | 11/2004 | Tsukamoto et al. |
| 2005/0007118 A1 | 1/2005 | Kitching et al. |
| 2005/0046851 A1 | 3/2005 | Riley, Jr. et al. |
| 2005/0206377 A1 | 9/2005 | Romalis et al. |
| 2007/0076776 A1 | 4/2007 | Lust et al. |
| 2007/0120563 A1 | 5/2007 | Kawabata et al. |
| 2007/0167723 A1 | 7/2007 | Park et al. |
| 2007/0205767 A1 | 9/2007 | Xu et al. |
| 2009/0079426 A1 | 3/2009 | Anderson |
| 2009/0101806 A1 | 4/2009 | Masuda |
| 2010/0039106 A1* | 2/2010 | Edelstein ............... G01R 33/05 324/253 |
| 2010/0219820 A1 | 9/2010 | Skidmore et al. |
| 2011/0062956 A1 | 3/2011 | Edelstein et al. |
| 2012/0112749 A1 | 5/2012 | Budker et al. |
| 2013/0082700 A1 | 4/2013 | Mizutani et al. |
| 2013/0082701 A1 | 4/2013 | Mizutani et al. |
| 2013/0265042 A1 | 10/2013 | Kawabata et al. |
| 2013/0313113 A1* | 11/2013 | Koser ................... B03C 1/0335 204/451 |
| 2013/0314092 A1* | 11/2013 | Shumway ................ G01V 3/40 324/346 |
| 2014/0121491 A1 | 5/2014 | Zhang |
| 2014/0306700 A1 | 10/2014 | Kamada et al. |
| 2014/0354275 A1 | 12/2014 | Sheng et al. |
| 2015/0022200 A1 | 1/2015 | Ichihara et al. |
| 2015/0054504 A1 | 2/2015 | Ichihara et al. |
| 2015/0108974 A1* | 4/2015 | Kennedy .............. G01R 33/098 324/252 |
| 2015/0378316 A1 | 12/2015 | Parsa et al. |
| 2016/0061913 A1 | 3/2016 | Kobayashi et al. |
| 2016/0116553 A1 | 4/2016 | Kim et al. |
| 2016/0223627 A1 | 8/2016 | Shah et al. |
| 2016/0291099 A1 | 10/2016 | Ueno |
| 2016/0313417 A1 | 10/2016 | Kawabata et al. |
| 2017/0023653 A1 | 1/2017 | Kobayashi et al. |
| 2017/0023654 A1 | 1/2017 | Kobayashi et al. |
| 2017/0067969 A1 | 3/2017 | Butters et al. |
| 2017/0199138 A1 | 7/2017 | Parsa et al. |
| 2017/0199251 A1 | 7/2017 | Fujii et al. |
| 2017/0261564 A1 | 9/2017 | Gabrys et al. |
| 2017/0331485 A1 | 11/2017 | Gobet et al. |
| 2017/0343617 A1 | 11/2017 | Manickam et al. |
| 2017/0343695 A1 | 11/2017 | Stetson et al. |
| 2017/0356969 A1 | 12/2017 | Ueno |
| 2017/0360322 A1 | 12/2017 | Ueno |
| 2017/0363695 A1 | 12/2017 | Ueno |
| 2018/0003777 A1 | 1/2018 | Sorenson et al. |
| 2018/0038921 A1 | 2/2018 | Parsa et al. |
| 2018/0100749 A1 | 4/2018 | Waters et al. |
| 2018/0128885 A1 | 5/2018 | Parsa et al. |
| 2018/0156875 A1 | 6/2018 | Herbsommer et al. |
| 2018/0219353 A1 | 8/2018 | Shah |
| 2018/0238974 A1 | 8/2018 | Shah et al. |
| 2018/0296992 A1* | 10/2018 | Di Carlo ............ G01N 35/1002 |
| 2018/0313908 A1 | 11/2018 | Knappe et al. |
| 2018/0313913 A1 | 11/2018 | DeNatale et al. |
| 2018/0372813 A1 | 12/2018 | Bulatowicz et al. |
| 2019/0128412 A1* | 5/2019 | Che ...................... F03B 13/148 |
| 2019/0391213 A1 | 12/2019 | Alford |
| 2020/0025844 A1 | 1/2020 | Alford et al. |
| 2020/0057115 A1 | 2/2020 | Jiménez-Martínez et al. |
| 2020/0057116 A1 | 2/2020 | Zorzos et al. |
| 2020/0064421 A1 | 2/2020 | Kobayashi et al. |
| 2020/0072916 A1 | 3/2020 | Alford et al. |
| 2020/0088811 A1 | 3/2020 | Mohseni |
| 2020/0241094 A1 | 7/2020 | Alford |
| 2020/0256929 A1 | 8/2020 | Ledbetter et al. |
| 2020/0309873 A1 | 10/2020 | Ledbetter et al. |
| 2020/0334559 A1 | 10/2020 | Anderson et al. |
| 2020/0341081 A1 | 10/2020 | Mohseni et al. |
| 2020/0381128 A1 | 12/2020 | Pratt et al. |

(56) References Cited

U.S. PATENT DOCUMENTS

| | | |
|---|---|---|
| 2020/0400763 A1 | 12/2020 | Pratt |
| 2021/0063510 A1 | 3/2021 | Ledbetter |

FOREIGN PATENT DOCUMENTS

| | | | |
|---|---|---|---|
| CN | 107562188 | | 1/2018 |
| CN | 107562188 A | * | 1/2018 |
| EP | 2738627 A3 | | 6/2014 |
| EP | 2380029 B1 | | 10/2015 |
| EP | 3037836 B1 | | 9/2017 |
| JP | 2012100839 | | 5/2012 |
| JP | 2016109665 | | 6/2016 |
| JP | 2018004462 | | 1/2018 |
| WO | 2005/081794 | | 9/2005 |
| WO | 2014/031985 | | 2/2014 |
| WO | 2017/095998 | | 6/2017 |

OTHER PUBLICATIONS

Okada, Y.C., Lahteenmäki, A. and Xu, C., "Experimental analysis of distortion of magnetoencephalography signals by the skull." Clinical neurophysiology 110 (2), 230-238 (1999).

Robinson, J.T., Pohlmeyer, E., Gather, M.C., Kemere, C., Kitching, J.E., Malliaras, G.G., Marblestone, A., Shepard, K. L., Stieglitz, T. and Xie, C., "Developing Next-Generation Brain Sensing Technologies—A Review." IEEE sensors journal, 19(22), 10163-10175 (2019).

Shah, V., Knappe, S., Schwindt, P.D. and Kitching, J., "Subpicotesla atomic magnetometry with a microfabricated vapour cell." Nature Photon 1, 649-652 (2007).

Griffith, W.C., Knappe, S. and Kitching, J., "Femtotesla atomic magnetometry in a microfabricated vapor cell." Optics express 18, (26), 27167-27172 (2010).

Tierney, T.M., Holmes, N., Mellor, S., López, J.D., Roberts, G., Hill, R.M., Boto, E., Leggett, J., Shah, V., Brookes, M.J. and Bowtell, R., "Optically pumped magnetometers: From quantum origins to multi-channel magnetoencephalography." NeuroImage, 199, 598-608 (2019).

Iivanainen, J., Zetter, R., Grön, M., Hakkarainen, K. and Parkkonen, L., "On-scalp MEG system utilizing an actively shielded array of optically-pumped magnetometers." Neuroimage 194, 244-258 (2019).

Iivanainen, J., Stenroos, M. and Parkkonen, L., "Measuring MEG closer to the brain: Performance of on-scalp sensor arrays." NeuroImage 147, 542-553 (2017).

Kitching, J., Knappe, S., Gerginov, V., Shah, V., Schwindt, P.D., Lindseth, B., Donley E.A., "Chip-scale atomic devices: precision atomic instruments based on MEMS." In Frequency Standards And Metrology, 445-453 (2009).

Kitching, J., Knappe, S. and Donley, E.A., "Atomic sensors—a review." IEEE Sensors Journal, 11(9), 1749-1758 (2011).

Budker, D. and Romalis, M., "Optical magnetometry". Nature physics, 3(4), 227-234 (2007).

Happer, W., "Optical pumping", Rev. Mod. Phys., 44 (2), 169-249 (1972).

Purcell, E.M., Field, G.B., "Influence of collisions upon population of hyperfine states in hydrogen", Astrophys. J., 124, 542 (1956).

Ledbetter, M.P., Savukov, I.M., Acosta, V.M., Budker, D. and Romalis, M.V., "Spin-exchange-relaxation-free magnetometry with Cs vapor." Physical Review A, 77(3), 033408 (2008).

Bloom, A. L., "Principles of operation of the rubidium vapor magnetometer." Applied Optics 1(1), 61-68 (1962).

Bell, W.E., and Bloom, A.L., "Optically driven spin precession." Physical Review Letters 6, (6), 280 (1961).

Roberts, G., Holmes, N., Alexander, N., Boto, E., Leggett, J., Hill, R.M., Shah, V., Rea, M., Vaughan, R., Maguire, E.A. and Kessler, K., "Towards OPM-MEG in a virtual reality environment." NeuroImage, 199, 408-417 (2019).

Zhang, R., Xiao, W., Ding, Y., Feng, Y., Peng, X., Shen, L., Sun, C., Wu, T., Wu, Y., Yang, Y. and Zheng, Z., "Recording brain activities in unshielded Earth's field with optically pumped atomic magnetometers." Science Advances, 6(24) (2020).

De Cheveigné, A., Wong, D.D., Di Liberto, G., Hjortkjaer, J., Slaney, M. and Lalor, E., "Decoding the auditory brain with canonical component analysis." NeuroImage, 172, 206-216 (2018).

Mellinger, J., Schalk, G., Braun, C., Preissl, H., Rosenstiel, W., Birbaumer, N. and Kubler, A., "An MEG-based brain-computer interface (BCI)." Neuroimage, 36(3), 581-593 (2007).

Wolpaw, J.R., McFarland, D.J., Neat, G.W. and Forneris, C.A., "An EEG-based brain-computer interface for cursor control." Electroencephalography and clinical neurophysiology, 78(3), 252-259 (1991).

Lightfoot, G., "Summary of the N1-P2 cortical auditory evoked potential to estimate the auditory threshold in adults". Seminars in hearing, 37(1), 1 (2016).

Virtanen, J., Ahveninen, J., Ilmoniemi, R. J., Näätänen, R., & Pekkonen, E., "Replicability of MEG and EEG measures of the auditory N1/N1m-response." Electroencephalography and Clinical Neurophysiology/Evoked Potentials Section, 108(3), 291-298 (1998).

Gascoyne, L., Furlong, P. L., Hillebrand, A., Worthen, S. F., & Witton, C., "Localising the auditory N1m with event-related beamformers: localisation accuracy following bilateral and unilateral stimulation." Scientific reports, 6(1), 1-9 (2016).

Boma, A., Carter, T.R., Goldberg, J.D., Colombo, A.P., Jau, Y.Y., Berry, C., McKay, J., Stephen, J., Weisend, M. and Schwindt, P.D., "A 20-channel magnetoencephalography system based on optically pumped magnetometers." Physics in Medicine & Biology, 62(23), 8909 (2017).

Pyragius, T., Marin Florez, H., & Fernholz, T. (2019). A Voigt effect based 3D vector magnetometer. Physical Review A, 100(2), https://doi.org/10.1103/PhysRevA.100.023416.

Rui Zhang, Rahul Mhaskar, Ken Smith, Easswar Balasubramaniam, Mark Prouty. "All Optical Scalar Atomic Magnetometer Capable of Vector Measurement," Submitted on Nov. 17, 2020. https://arxiv.org/abs/2011.08943; Geometrics, Inc., San Jose, CA, 95131, USA.

Hill RM, Boto E, Holmes N, et al. A tool for functional brain imaging with lifespan compliance [published correction appears in Nat Commun. Dec. 4, 2019;10(1):5628]. NatCommun. 2019;10(1):4785. Published Nov. 5, 2019. doi:10.1038/S41467-019-12486-x.

Zetter, R., Iivanainen, J. & Parkkonen, L. Optical Co-registration of MRI and On-scalp MEG. Sci Rep 9, 5490 (2019). https://doi.org/10.1038/s41598-019-41763-4.

Garrido-Jurado, Sergio, Rafael Muñoz-Salinas, Francisco José Madrid-Cuevas and Manuel J. Marín-Jiménez. "Automatic generation and detection of highly reliable fiducial markers under occlusion." Pattern Recognit. 47 (2014): 2280-2292.

Hill RM, Boto E, Rea M, et al. Multi-channel whole-head OPM-MEG: Helmet design and a comparison with a conventional system [published online ahead of print, May 29, 2020]. Neuroimage. 2020;219:116995. doi:10.1016/j.neuroimage.2020.116995.

V. Kazemi and J. Sullivan, "One millisecond face alignment with an ensemble of regression trees," 2014 IEEE Conference on Computer Vision and Pattern Recognition, Columbus, OH, 2014, pp. 1867-1874, doi: 10.1109/CVPR.2014.241.

Holmes, N., Tierney, T.M., Leggett, J. et al. Balanced, bi-planar magnetic field and field gradient coils for field compensation in wearable magnetoencephalography. Sci Rep 9, 14196 (2019).

N. Holmes, J. Leggett, E. Boto, G. Roberts, R.M. Hill, T.M. Tierney, V. Shah, G.R. Barnes, M.J. Brookes, R. Bowtell A bi-planar coil system for nulling background magnetic fields in scalp mounted magnetoencephalography Neuroimage, 181 (2018), pp. 760-774.

J. M. Leger et al., In-flight performance of the Absolute Scalar Magnetometer vector mode on board the Swarm satellites, Earth, Planets, and Space (2015) 67:57.

Alexandrov, E. B., Balabas, M. V., Kulyasov, V. N., Ivanov, A. E., Pazgalev, A. S., Rasson, J. L., . . . (2004). Three-component variometer based on a scalar potassium sensor. Measurement Science and Technology, 15(5), 918-922.

Gravrand, O., Khokhlov, A., & JL, L. M. (2001). On the calibration of a vectorial 4He pumped magnetometer. Earth, planets and space , 53 (10), 949-958.

Boma, Amir & Carter, Tony & Colombo, Anthony & Jau, Y-Y & McKay, Jim & Weisend, Michael & Taulu, Samu & Stephen, Julia (56) References Cited

OTHER PUBLICATIONS

& Schwindt, Peter. (2018). Non-lnvasive Functional-Brain-Imaging with a Novel Magnetoencephalography System. 9 Pages.
Vrba J, Robinson SE. Signal processing in magnetoencephalography. Methods. 2001;25(2):249-271. doi:10.1006/meth.2001.1238.
Uusitalo M and Ilmoniemi R., 1997, Signal-space projection method for separating MEG or EEG into components. Med. Biol. Comput. (35) 135-140.
Taulu S and Kajola M., 2005, Presentation of electromagnetic multichannel data: the signal space separation method. J. Appl. Phys. (97) 124905 (2005).
Taulu S, Simola J and Kajola M., 2005, Applications of the signal space separation method. IEEE Trans. Signal Process. (53) 3359-3372 (2005).
Taulu S, Simola J., 2006, Spatiotemporal signal space separation method for rejecting nearby interference in MEG measurements. Phys. Med. Biol. (51) 1759-1768 (2006).
Johnson, et al.. Magnetoencephalography with a two-color pump-probe, fiber-coupled atomic magnetometer, Applied Physics Letters 97, 243703 2010.
Zhang, et al., Magnetoencephalography using a compact multichannel atomic magnetometer with pump-probe configuration, AIP Advances 8, 125028 (2018).
Xia, H. & Ben-Amar Baranga, Andrei & Hoffman, D. & Romalis, Michael. (2006). Magnetoencephalography with an atomic magnetometer. Applied Physics Letters—Appl Phys Lett. 89. 10.1063/1.2392722.
Ilmoniemi, R. (2009). The triangle phantom in magnetoencephalography. In 24th Annual Meeting of Japan Biomagnetism and Bioelecctromagnetics Society, Kanazawa, Japan, 28.29.5.2009 (pp. 6263).
Oyama D. Dry phantom for magnetoencephalography—Configuration, calibration, and contribution. J Neurosci Methods. 2015;251:24-36. doi: 0.1016/j.jneumeth.2015.05.004.
Chutani, R., Maurice, V., Passilly, N. et al. Laser light routing in an elongated micromachined vapor cell with diffraction gratings for atomic clock applications. Sci Rep 5, 14001 (2015). https://doi.org/10.1038/srep14001.
Eklund, E. Jesper, Andrei M. Shkel, Svenja Knappe, Elizabeth A. Donley and John Kitching. "Glass-blown spherical microcells for chip-scale atomic devices." (2008).
Jiménez-Martínez R, Kennedy DJ, Rosenbluh M, et al. Optical hyperpolarization and NMR detection of 129Xe on a microfluidic chip. Nat Commun. 2014;5:3908. Published May 20, 2014. doi:10.1038/ncomms4908.
Boto, Elena, Sofie S. Meyer, Vishal Shah, Orang Alem, Svenja Knappe, Peter Kruger, T. Mark Fromhold, et al. "A New Generation of Magnetoencephalography: Room Temperature Measurements Using Optically-Pumped Magnetometers." NeuroImage 149 (Apr. 1, 2017): 404-14.
Bruno, A. C., and P. Costa Ribeiro. "Spatial Fourier Calibration Method for Multichannel SQUID Magnetometers." Review of Scientific Instruments 62, No. 4 (Apr. 1, 1991): 1005-9.
Chella, Federico, Filippo Zappasodi, Laura Marzetti, Stefania Della Penna, and Vittorio Pizzella. "Calibration of a Multichannel MEG System Based on the Signal Space Separation Method." Physics in Medicine and Biology 57 (Jul. 13, 2012): 4855-70.
Pasquarelli, A, M De Melis, Laura Marzetti, Hans-Peter Müller, and S N Ernè. "Calibration of a Vector-MEG Helmet System." Neurology & Clinical Neurophysiology : NCN 2004 (Feb. 1, 2004): 94.
Pfeiffer, Christoph, Lau M. Andersen, Daniel Lundqvist, Matti Hämäläinen, Justin F. Schneiderman, and Robert Oostenveld. "Localizing On-Scalp MEG Sensors Using an Array of Magnetic Dipole Coils." PLOS ONE 13, No. 5 (May 10, 2018): e0191111.
Vivaldi, Valentina, Sara Sommariva, and Alberto Sorrentino. "A Simplex Method for the Calibration of a MEG Device." Communications in Applied and Industrial Mathematics 10 (Jan. 1, 2019): 35-46.
Nagel, S., & Spüler, M. (2019). Asynchronous non-invasive high-speed BCI speller with robust non-control state detection. Scientific Reports, 9(1), 8269.
Thielen, J., van den Broek, P., Farquhar, J., & Desain, P. (2015). Broad-Band Visually Evoked Potentials: Re(con)volution in Brain-Computer Interfacing. PloS One, 10(7), e0133797. https://doi.org/10.1371/journal.pone.0133797.
J. Kitching, "Chip-scale atomic devices," Appl. Phys. Rev. 5(3), 031302 (2018), 39 pages.
Manon Kok, Jeroen D. Hol and Thomas B. Schon (2017), "Using Inertial Sensors for Position and Orientation Estimation", Foundations and Trends in Signal Processing: vol. 11: No. 1-2, pp. 1-153. http://dx.doi.org/10.1561/2000000094.
Boto, E, Holmes, N, Leggett, J, Roberts, G, Shah, V, Meyer, SS, Muñoz, LD, Mullinger, KJ, Tierney, TM, Bestmann, S, Barnes, GR, Bowtell, R & Brookes, MJ 2018, 'Moving magnetoencephalography towards real world applications with a wearable system', Nature, vol. 555, pp. 657-661.
Ijsselsteijn, R & Kielpinski, Mark & Woetzel, S & Scholtes, Theo & Kessler, Ernst & Stolz, Ronny & Schultze, V & Meyer, H-G. (2012). A full optically operated magnetometer array: An experimental study. The Review of scientific instruments. 83. 113106. 10.1063/1.4766961.
Effect of magnetic anisotropy on magnetic shaking, E. Papernoa and I. Sasada. Journal of Applied Physics, vol. 85-8, Apr. 1999, pp. 4645-4647.
Feynman Lectures on Physics vol. II, Chapter 37. 1963. Richard Feynman, Robert Leighton, http://www.feynmanlectures.caltech.edu/II_37.html.
Allred, J. C., Lyman, R. N., Kornack, T. W., & Romalis, M. V. (2002). High-sensitivity atomic magnetometer unaffected by spin-exchange relaxation. Physical review letters, 89(13), 130801.
Balabas et al. Polarized alkali vapor with minute-long transverse spin-relaxation time, Phys. Rev. Lett. 105, 070801—Published Aug. 12, 2010.
Barbieri, F., Trauchessec, V., Caruso, L., Trejo-Rosillo, J., Telenczuk, B., Paul, E., . . . & Ouanounou, G. (2016). Local recording of biological magnetic fields using Giant Magneto Resistance-based micro-probes. Scientific reports, 6, 39330.
Dmitry Budker and Michael Romalis, "Optical Magnetometry," Nature Physics, 2008, https://arxiv.org/abs/physics/0611246v1.
Anthony P. Colombo, Tony R, Carter, Amir Borna, Yuan-Yu Jau, Cort N. Johnson, Amber L. Dagel, and Peter D. D. Schwindt, "Four-channel optically pumped atomic magnetometer for magnetoencephalography," Opt. Express 24, 15403-15416 (2016).
Dang, H.B. & Maloof, A.C. & Romalis, Michael. (2009). Ultra-high sensitivity magnetic field and magnetization measurements with an atomic magnetometer. Applied Physics Letters. 97. 10.1063/1.3491215.
Donley, E.A. & Hodby, E & Hollberg, L & Kitching, J. (2007). Demonstration of high-performance compact magnetic shields for chip-scale atomic devices. The Review of scientific instruments. 78. 083102.
Hämäläinen, Matti & Hari, Riitta & Ilmoniemi, Risto J. & Knuutila, Jukka & Lounasmaa, Olli V. Apr. 1993. Magnetoencephalograph—theory, instrumentation, and applications to noninvasive studies of the working human brain. Reviews of Modern Physics. vol. 65, Issue 2. 413-497.
Hunter, D. and Piccolomo, S. and Pritchard, J. D. and Brockie, N. L. and Dyer, T. E. and Riis, E. (2018) Free-induction-decay magnetometer based on a microfabricated Cs vapor cell. Physical Review Applied (10).ISSN 2331-7019.
Jiménez-Martínez, R., Griffith, W. C., Wang, Y. J., Knappe, S., Kitching, J., Smith, K., & Prouty, M. D. (2010). Sensitivity comparison of Mx and frequency-modulated bell-bloom Cs magnetometers in a microfabricated cell. IEEE Transactions on Instrumentation and Measurement, 59(2), 372-378.
Kiwoong Kim, Sarno Begus, Hui Xia, Seung-Kyun Lee, Vojko Jazbinsek, Zvonko Trontelj, Michael V. Romalis, Multichannel atomic magnetometer for magnetoencephalography: A configuration study. NeuroImage 89 (2014) 143-151 http://physics.princeton.edu/romalis/papers/Kim_2014.pdf.
Knappe, Svenja & Sander, Tilmann & Trahms, Lutz. (2012). Optically-Pumped Magnetometers for MEG. Magnetoencephalography: From Signals to Dynamic Cortical Networks. 993-999. 10.1007/978-3-642-33045-2_49.

(56) References Cited

OTHER PUBLICATIONS

Kominis, I.K., Kornack, T.W., Allred, J.C. and Romalis, M.V., 2003. A subfemtotesla multichannel atomic magnetometer. Nature, 422(6932), p. 596.
Korth H., K. Strohbehn, F. Tejada, A. G. Andreou, J. Kitching, S. Knappe, S. J. Lehtonen, S. M. London, and M. Kafel (2016), Miniature atomic scalarmagnetometer for space based on the rubidium isotope 87Rb, J. Geophys. Res. Space Physics, 121, 7870-7880, doi:10.1002/2016JA022389.
Lenz, J. and Edelstein, S., 2006. Magnetic sensors and their applications. IEEE Sensors journal, 6(3), pp. 631-649.
Li, S & Vachaspati, Pranjal & Sheng, Dehong & Dural, Nezih & Romalis, Michael. (2011). Optical rotation in excess of 100 rad generated by Rb vapor in a multipass cell. Phys. Rev. A. 84. 10.1103/PhysRevA.84.061403.
Maze, J. R., Stanwix, P. L., Hodges, J. S., Hong, S., Taylor, J. M., Cappellaro, P., . . . & Yacoby, A. (2008). Nanoscale magnetic sensing with an individual electronic spin in diamond. Nature, 455(7213), 644.
Sander TH, Preusser J, Mhaskar R, Kitching J, Trahms L, Knappe S. Magnetoencephalography with a chip-scale atomic magnetometer. Biomed Opt Express. 2012;3(5):981-90.
J. Seltzer, S & Romalis, Michael. (2010). High-temperature alkali vapor cells with antirelaxation surface coatings. Journal of Applied Physics. 106. 114905-114905. 10.1063/1.3236649.
Seltzer, S. J., and Romalis, M.V., "Unshielded three-axis vector operation of a spin-exchange-relaxation-free atomic magnetometer." Applied physics letters 85.20 (2004): 4804-4806.
Sheng, Dong & R. Perry, Abigail & Krzyzewski, Sean & Geller, Shawn & Kitching, John & Knappe, Svenja. (2017). A microfabricated optically-pumped magnetic gradiometer. Applied Physics Letters. 110. 10.1063/1.4974349.
Sheng, Dehong & Li, S & Dural, Nezih & Romalis, Michael. (2013). Subfemtotesla Scalar Atomic Magnetometry Using Multipass Celis. Physical review letters. 110. 160802. 10.1103/PhysRevLett. 110.160802.
Volkmar Schultze et al. An Opticailv Pumped Magnetometer Working in the Light-Shift Dispersed Mz Mode, Sensors 2017, 17. 561; doi:10.3390/s17030561.
Fang, J. and Qin, J., 2012. In situ triaxial magnetic field compensation for the spin-exchange-relaxation-free atomic magnetometer. Review of Scientific Instruments, 83(10), p. 103104.
Joon Lee, Hyun & Shim, Jeong & Moon, Han Seb & Kim, Kiwoong. (2014). Flat-response spin-exchange relaxation free atomic magnetometer under negative feedback. Optics Express, 22. 10.1364/OE.22.019887.
Griffith, Clark & Jimenez-Martinez, Ricardo & Shah, Vishal & Knappe, Svenja & Kitching, John. (2009). Miniature atomic magnetometer integrated with flux concentrators. Applied Physics Letters—Appl Phys Lett. 94. 10.1063/1.3056152.
Lee, S.-K & Romalis, Michael. (2008). Calculation of Magnetic Field Noise from High-Permeability Magnetic Shields and Conducting Objects with Simple Geometry. Journal of Applied Physics. 103, 084904-084904. 10.1063/1.2885711.
Vovrosh, Jamie & Voulazeris, Georgios & Petrov, Plamen & Zou, Ji & Gaber Beshay, Youssef & Benn, Laura & Woolger, David & Attallah, Moataz & Boyer, Vincent & Bongs, Kai & Holynski, Michael. (2018). Additive manufacturing of magnetic shielding and ultra-high vacuum flange for cold atom sensors. Scientific Reports. 8. 10.1038/s41598-018-20352-x.
Kim, Young Jin & Savukov, I. (2016). Ultra-sensitive Magnetic Microscopy with an Optically Pumped Magnetometer. Scientific Reports. 6. 24773. 10.1038/srep24773.
Navau, Carles & Prat-Camps, Jordi & Sanchez, Alvaro. (2012). Magnetic Energy Harvesting and Concentration at a Distance by Transformation Optics. Physical review letters. 109. 263903. 10.1103/PhysRevLett.109.263903.
Orang Alem, Rahul Mhaskar, Ricardo Jiménez-Martínez, Dong Sheng, John LeBlanc, Lutz Trahms, Tilmann Sander, John Kitching, and Svenja Knappe, "Magnetic field imaging with microfabricated optically-pumped magnetometers," Opt. Express 25, 7849-7858 (2017).
Slocum et al., Self-Calibrating Vector Magnetometer for Space, https://esto.nasa.gov/conferences/estc-2002/Papers/B3P4(Slocum). pdf.
Dupont-Roc, J & Haroche, S & Cohen-Tannoudji, C. (1969). Detection of very weak magnetic fields (10-9gauss) by 87Rb zero-field level crossing resonances, Physics Letters A—Phys Lett A. 28. 638-639. 10.1016/0375-9601(69)90480-0.
J. A. Neuman, P. Wang, and A. Gallagher, Robust high-temperature sapphire cell for metal vapors, Review of Scientific Instruments, vol. 66, Issue 4, Apr. 1995, pp. 3021-3023.
Borna, Amir, et al. "A 20-channel magnetoencephalography system based on optically pumped magnetometers." Physics in Medicine & Biology 62.23 (2017): 8909.
R. E. Slocum & L. J. Ryan, Design and operation of the minature vector laser magnetometer, Nasa Earth Science Technology Conference 2003.
Schoenmaker, Jeroen & R Pirota, K & Teixeira, Julio. (2013). Magnetic flux amplification by Lenz lenses. The Review of scientific instruments. 84. 085120. 10.1063/1.4819234.
Hu, Yanhui & Hu, Zhaohui & Liu, Xuejing & Li, Yang & Zhang, Ji & Yao, Han & Ding, Ming. (2017). Reduction of far off-resonance laser frequency drifts based on the second harmonic of electro-optic modulator detection in the optically pumped magnetometer. Applied Optics. 56. 5927. 10.1364/AO.56.005927.
Masuda, Y & Ino, T & Skoy, Vadim & Jones, G.L. (2005). 3He polarization via optical pumping in a birefringent cell. Applied Physics Letters. 87. 10.1063/1.2008370.
A.B. Baranga et al., An atomic magnetometer for brain activity imaging, Real Time Conference 2005. 14th IEEE-NPSS. pp. 417-418.
Larry J. Ryan, Robert E. Slocum, and Robert B. Steves, Miniature Vector Laser Magnetometer Measurements of Earth's Field, May 10, 2004, 4 pgs.
Lorenz, V. O., Dai, X., Green, H., Asnicar, T. R., & Cundiff, S. T. (2008). High-density, high-temperature alkali vapor cell. Review of Scientific Instruments, 79(12), 4 pages.
F. Jackson Kimball, D & Dudley, J & Li, Y & Thulasi, Swecha & Pustelny, Szymon & Budker, Dmitry & Zolotarev, Max. (2016). Magnetic shielding and exotic spin-dependent interactions. Physical Review D. 94. 10.1103/PhysRevD.94.082005.
Huang, Haichao, et al. "Single-beam three-axis atomic magnetometer." Applied Physics Letters 109.6 (2016): 062404. (Year: 2016).
Scott Jeffrey Seltzer: "Developments in alkali-metal atomic magnetometry", Nov. 1, 2008 (Nov. 1, 2008). XP055616618, ISBN: 978-0-549-93355-7 Retrieved from the Internet: URL:http://physics. princeton.edu/atomic/romalis/papers/Seltzer%20Thesis.pdf [retrieved on Aug. 29, 2019] pp. 148-159.
Haifeng Dong et al: "Atomic-Signal-Based Zero-Field Finding Technique for Unshielded Atomic Vector Magnetometer", IEEE Sensors Journal, IEEE Service Center, New York, NY, US, vol. 13, No. 1, Jan. 1, 2013 (Jan. 1, 2013), pp. 186-189.
International Search Report and Written Opinion for PCT Application No. PCT/US2019/039865 dated Oct. 1, 2019.
Arjen Stolk, Ana Todorovic, Jan-Mathijs Schoffelen, and Robert Oostenveld. "Online and offline tools for head movement compensation in MEG." Neuroimage 68 (2013): 39-48.
Bagherzadeh, Yasaman, Daniel Baldauf, Dimitrios Pantazis, and Robert Desimone. "Alpha synchrony and the neurofeedback control of spatial attention." Neuron 105, No. 3 (2020): 577-587.

* cited by examiner

DYNAMIC MAGNETIC SHIELDING AND BEAMFORMING USING FERROFLUID FOR COMPACT MAGNETOENCEPHALOGRAPHY (MEG)

CROSS-REFERENCE TO RELATED APPLICATIONS

This application claims the benefit of U.S. Provisional Patent Application Ser. No. 62/732,791, filed Sep. 18, 2018, which is incorporated herein by reference.

FIELD

The present disclosure is directed to the area of magnetic field measurement systems using optically pumped magnetometers or other suitable magnetometers. The present disclosure is also directed to magnetic field measurement systems that include a shield or beam former that uses a ferrofluid.

BACKGROUND

In the nervous system, neurons propagate signals via action potentials. These are brief electric currents which flow down the length of a neuron causing chemical transmitters to be released at a synapse. The time-varying electrical current within the neuron generates a magnetic field, which propagates through the human body. Magnetoencephalography (MEG), the measurement of magnetic fields generated by the brain, is one method for observing these neural signals.

Existing systems for observing or measuring MEG typically utilize superconducting quantum interference devices (SQUIDs) or collections of discrete optically pumped magnetometers (OPMs). SQUIDs require cryogenic cooling which is bulky and expensive and requires a lot of maintenance which preclude their use in mobile or wearable devices.

Optical magnetometry can include the use of optical methods to measure a magnetic field with very high accuracy—on the order of $1 \times 10^{-15}$ Tesla. Of particular interest for their high-sensitivity, an optically pumped magnetometer (OPM) can be used in optical magnetometry to measure weak magnetic fields. In at least some embodiments, the OPM has an alkali vapor gas cell that contains alkali metal atoms in a combination of gas, liquid, or solid states (depending on temperature). The gas cell may contain a quenching gas, buffer gas, or specialized antirelaxation coatings or any combination thereof. The size of the gas cells can vary from a fraction of a millimeter up to several centimeters.

BRIEF SUMMARY

One embodiment is a magnetic field measurement system that includes at least one magnetometer; and a ferrofluid shield disposed at least partially around the at least one magnetometer, the ferrofluid shield including a microfluid fabric and a ferrofluid disposed in or flowable into the microfluid fabric.

In at least some embodiments, the microfluid fabric includes a plurality of ferrofluid channels extending through the microfluid fabric. In at least some embodiments, the ferrofluid shield further includes a ferrofluid reservoir in fluid communication with the microfluid fabric and configured to hold at least a portion of the ferrofluid.

In at least some embodiments, the ferrofluid shield further includes a pressure fluid disposed in or flowable into the microfluid fabric and configured to facilitate flow or disposition of the ferrofluid within the microfluid fabric. In at least some embodiments, the ferrofluid shield further includes a pressure fluid reservoir in fluid communication with the microfluid fabric and configured to hold at least a portion of the pressure fluid. In at least some embodiments, the ferrofluid shield further includes a plurality of ferrofluid channels extending through the microfluid fabric and a plurality of pressure fluid channels extending through the microfluid fabric. In at least some embodiments, the ferrofluid channels and pressure fluid channels are arranged so that the pressure fluid can operated as valves at positions along the ferrofluid channels. In at least some embodiments, the ferrofluid shield further includes a controller configured to alter disposition of the ferrofluid within the microfluid fabric using the pressure fluid.

In at least some embodiments, the system includes a plurality of the magnetometers and the ferrofluid shield and the magnetometers are arranged as part of a helmet, cap, hat, hood, scarf, wrap, or other headgear. In at least some embodiments, the ferrofluid shield is configured to generate at least one flux concentrator using the ferrofluid to concentrate magnetic field lines from a magnetic field source towards the at least one magnetometer.

Another embodiment is a magnetic field measurement system that includes at least one magnetometer; and a ferrofluid shield disposed at least partially around the at least one magnetometer, the ferrofluid shield including a ferrofluid and a controller configured to alter an arrangement of the ferrofluid within the ferrofluid shield.

In at least some embodiments, the ferrofluid shield further includes a layer having one or more ferrofluid channels extending through the layer, wherein the ferrofluid is disposed within or flowable into the one or more ferrofluid channels. In at least some embodiments, the ferrofluid shield further includes a ferrofluid reservoir configured to hold at least a portion of the ferrofluid.

In at least some embodiments, the ferrofluid shield further includes a pressure fluid configured to facilitate flow or disposition of the ferrofluid within the ferrofluid shield. In at least some embodiments, the ferrofluid shield further includes a pressure fluid reservoir configured to hold at least a portion of the pressure fluid. In at least some embodiments, the ferrofluid shield further includes a layer having one or more ferrofluid channels and one or more pressure channels extending through the layer. In at least some embodiments, the ferrofluid channels and pressure fluid channels are arranged so that the pressure fluid can operated as valves at positions along the ferrofluid channels. In at least some embodiments, the controller is configured to alter the arrangement of the ferrofluid within the ferrofluid shield using the pressure fluid.

In at least some embodiments, the system includes a plurality of the magnetometers and the ferrofluid shield and the magnetometers are arranged as part of a helmet, cap, hat, hood, scarf, wrap, or other headgear. In at least some embodiments, the ferrofluid shield is configured to generate at least one flux concentrator using the ferrofluid to concentrate magnetic field lines from a magnetic field source towards the at least one magnetometer.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

The present disclosure is directed to the area of magnetic field measurement systems using optically pumped magnetometers or other suitable magnetometers. The present disclosure is also directed to magnetic field measurement systems that include a shield or beam former that uses a ferrofluid.

Herein the terms "ambient background magnetic field" and "background magnetic field" are interchangeable and used to identify the magnetic field or fields associated with sources other than the magnetic field measurement system and the biological source(s) (for example, neural signals from a user's brain) or other source(s) of interest. The terms can include, for example, the Earth's magnetic field, as well as magnetic fields from magnets, electromagnets, electrical devices, and other signal or field generators in the environment, except for the magnetic field generator(s) that are part of the magnetic field measurement system.

The terms "gas cell", "vapor cell", and "vapor gas cell" are used interchangeably herein. Below, a gas cell containing alkali metal vapor is described, but it will be recognized that other gas cells can contain different gases or vapors for operation.

An optically pumped magnetometer (OPM) is a basic component used in optical magnetometry to measure magnetic fields. While there are many types of OPMs, in general magnetometers operate in two modalities: vector mode and scalar mode. In vector mode, the OPM can measure one, two, or all three vector components of the magnetic field; while in scalar mode the OPM can measure the total magnitude of the magnetic field.

Vector mode magnetometers measure a specific component of the magnetic field, such as the radial and tangential components of magnetic fields with respect the scalp of the human head. Vector mode OPMs often operate at zero-field and may utilize a spin exchange relaxation free (SERF) mode to reach femto-Tesla sensitivities. A SERF mode OPM is one example of a vector mode OPM, but other vector mode OPMs can be used at higher magnetic fields. These SERF mode magnetometers can have high sensitivity but may not function in the presence of magnetic fields higher than the linewidth of the magnetic resonance of the atoms of about 10 nT, which is much smaller than the magnetic field strength generated by the Earth. As a result, conventional SERF mode magnetometers often operate inside magnetically shielded rooms that isolate the sensor from ambient magnetic fields including Earth's magnetic field.

Magnetometers operating in the scalar mode can measure the total magnitude of the magnetic field. (Magnetometers in the vector mode can also be used for magnitude measurements.) Scalar mode OPMs often have lower sensitivity than SERF mode OPMs and are capable of operating in higher magnetic field environments.

The magnetic field measurement systems described herein can be used to measure or observe electromagnetic signals generated by one or more sources (for example, biological sources). The system can measure biologically generated magnetic fields. Aspects of a magnetic field measurement system will be exemplified below using magnetic signals from the brain of a user; however, biological signals from other areas of the body, as well as non-biological signals, can be measured using the system. Uses for this technology outside biomedical sensing include, but are not limited to, navigation, mineral exploration, non-destructive testing, detection of underground devices, asteroid mining, and space applications. In at least some embodiments, the system can be a wearable magnetoencephalography (MEG) system that can be used outside a magnetically shielded room.

Figure 1A:
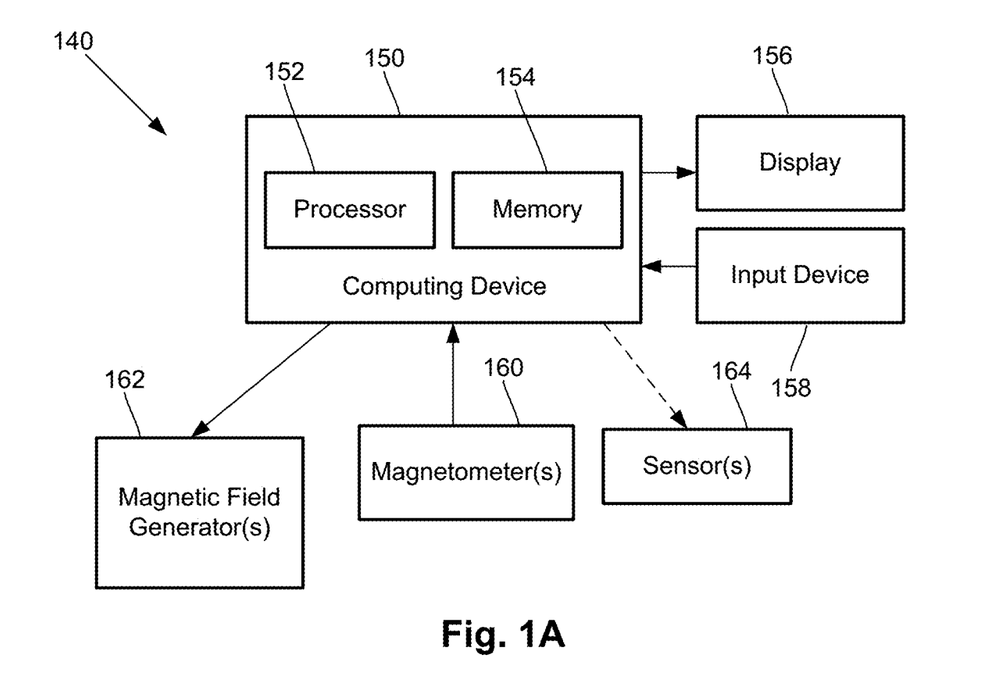
FIG. 1A is a schematic block diagram of one embodiment of a magnetic field measurement system, according to the invention.

FIG. 1A is a block diagram of components of one embodiment of a magnetic field measurement system 140. The system 140 can include a computing device 150 or any other similar device that includes a processor 152 and a memory 154, a display 156, an input device 158, one or more magnetometers 160, one or more magnetic field generators 162, and, optionally, one or more sensors 164. The system 140 and its use and operation will be described herein with respect to the measurement of neural signals arising from signal sources in the brain of a user as an example. It will be understood, however, that the system can be adapted and used to measure other neural signals, other biological signals, as well as non-biological signals.

The computing device 150 can be a computer, tablet, mobile device, field programmable gate array (FPGA), microcontroller, or any other suitable device for processing information or instructions. The computing device 150 can be local to the user or can include components that are non-local to the user including one or both of the processor 152 or memory 154 (or portions thereof). For example, in at least some embodiments, the user may operate a terminal that is connected to a non-local computing device. In other embodiments, the memory 154 can be non-local to the user.

The computing device 150 can utilize any suitable processor 152 including one or more hardware processors that may be local to the user or non-local to the user or other components of the computing device. The processor 152 is configured to execute instructions.

Any suitable memory 154 can be used for the computing device 150. The memory 154 illustrates a type of computer-readable media, namely computer-readable storage media. Computer-readable storage media may include, but is not limited to, volatile, nonvolatile, non-transitory, removable, and non-removable media implemented in any method or technology for storage of information, such as computer readable instructions, data structures, program modules, or other data. Examples of computer-readable storage media include RAM, ROM, EEPROM, flash memory, or other memory technology, CD-ROM, digital versatile disks ("DVD") or other optical storage, magnetic cassettes, magnetic tape, magnetic disk storage or other magnetic storage devices, or any other medium which can be used to store the desired information and which can be accessed by a computing device.

Communication methods provide another type of computer readable media; namely communication media. Communication media typically embodies computer-readable instructions, data structures, program modules, or other data in a modulated data signal such as a carrier wave, data signal, or other transport mechanism and include any information delivery media. The terms "modulated data signal," and "carrier-wave signal" includes a signal that has one or more of its characteristics set or changed in such a manner as to encode information, instructions, data, and the like, in the signal. By way of example, communication media includes wired media such as twisted pair, coaxial cable, fiber optics, wave guides, and other wired media and wireless media such as acoustic, RF, infrared, and other wireless media.

The display 156 can be any suitable display device, such as a monitor, screen, or the like, and can include a printer. In some embodiments, the display is optional. In some embodiments, the display 156 may be integrated into a single unit with the computing device 150, such as a tablet, smart phone, or smart watch. In at least some embodiments, the display is not local to the user. The input device 158 can be, for example, a keyboard, mouse, touch screen, track ball, joystick, voice recognition system, or any combination thereof, or the like. In at least some embodiments, the input device is not local to the user.

The magnetic field generator(s) 162 can be, for example, Helmholtz coils, solenoid coils, planar coils, saddle coils, electromagnets, permanent magnets, or any other suitable arrangement for generating a magnetic field. The optional sensor(s) 164 can include, but are not limited to, one or more magnetic field sensors, position sensors, orientation sensors, accelerometers, image recorders, or the like or any combination thereof.

The one or more magnetometers 160 can be any suitable magnetometer including, but not limited to, any suitable optically pumped magnetometer. Arrays of magnetometers are described in more detail herein. In at least some embodiments, at least one of the one or more magnetometers (or all of the magnetometers) of the system is arranged for operation in the SERF mode. Examples of magnetic field measurement systems or methods of making such systems or components for such systems are described in U.S. patent application Ser. Nos. 16/213,980; 16/405,382; 16/418,478; 16/418,500; and 16/428,871, and U.S. Provisional Patent Applications Ser. Nos. 62/689,696; 62/699,596; 62/719,471; 62/719,475; 62/719,928; 62/723,933; 62/732,327; 62/732,791; 62/741,777; 62/743,343; 62/747,924; 62/745,144; 62/752,067; 62/776,895; 62/781,418; 62/796,958; 62/798,209; 62/798,330; 62/804,539; 62/826,045; 62/827,390; 62/836,421; 62/837,574; 62/837,587; 62/842,818; 62/855,820; 62/858,636; 62/860,001; and 62/865,049, all of which are incorporated herein by reference.

Figure 1B:
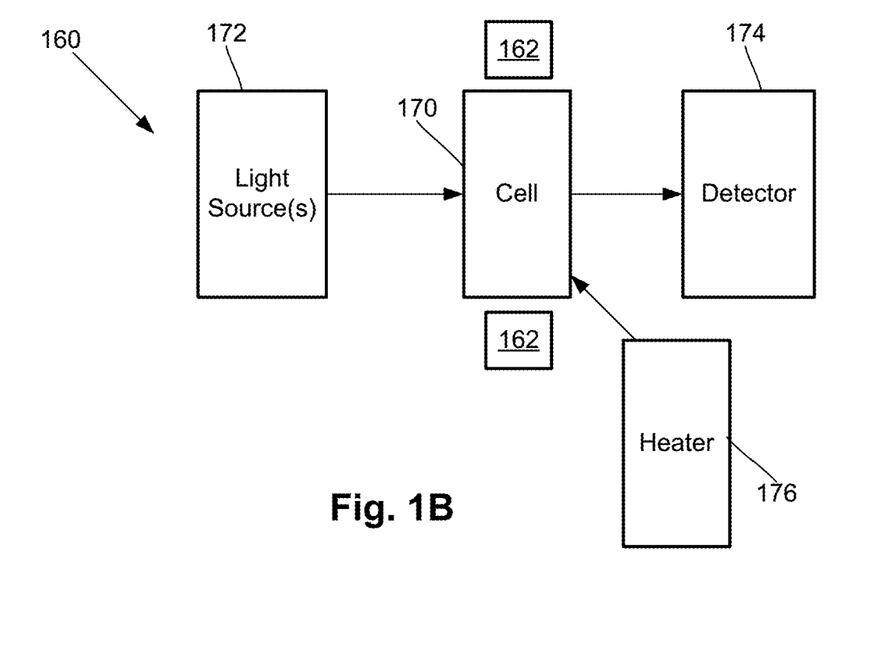
FIG. 1B is a schematic block diagram of one embodiment of a magnetometer, according to the invention.

FIG. 1B is a schematic block diagram of one embodiment of a magnetometer 160 which includes a vapor cell 170 (also referred to as a "cell") such as an alkali metal vapor cell; a heating device 176 to heat the cell 170; one or more light sources 172; and a detector 174. In addition, coils of a magnetic field generator 162 can be positioned around the vapor cell 170. The vapor cell 170 can include, for example, an alkali metal vapor (for example, rubidium in natural abundance, isotopically enriched rubidium, potassium, or cesium, or any other suitable alkali metal such as lithium, sodium, or francium) and, optionally, one, or both, of a quenching gas (for example, nitrogen) and a buffer gas (for example, nitrogen, helium, neon, or argon). In some embodiments, the vapor cell may include the alkali metal atoms in a prevaporized form prior to heating to generate the vapor.

Thee light source(s) 172 can include, for example, a laser to, respectively, optically pump the alkali metal atoms and probe the gas cell. The light source(s) 172 may also include optics (such as lenses, waveplates, collimators, polarizers, and objects with reflective surfaces) for beam shaping and polarization control and for directing the light from the light source to the cell and detector. Examples of suitable light sources include, but are not limited to, a diode laser (such as a vertical-cavity surface-emitting laser (VCSEL), distributed Bragg reflector laser (DBR), or distributed feedback laser (DFB)), light-emitting diode (LED), lamp, or any other suitable light source.

The detector 174 can include, for example, an optical detector (or an array of detectors) to measure the optical properties of the transmitted probe light field amplitude, phase, or polarization, as quantified through optical absorption and dispersion curves, spectrum, or polarization or the like or any combination thereof. Examples of suitable detectors include, but are not limited to, a photodiode, charge coupled device (CCD) array, CMOS array, camera, photodiode array, single photon avalanche diode (SPAD) array, avalanche photodiode (APD) array, or any other suitable optical sensor array that can measure the change in transmitted light at the optical wavelengths of interest.

Figure 2:
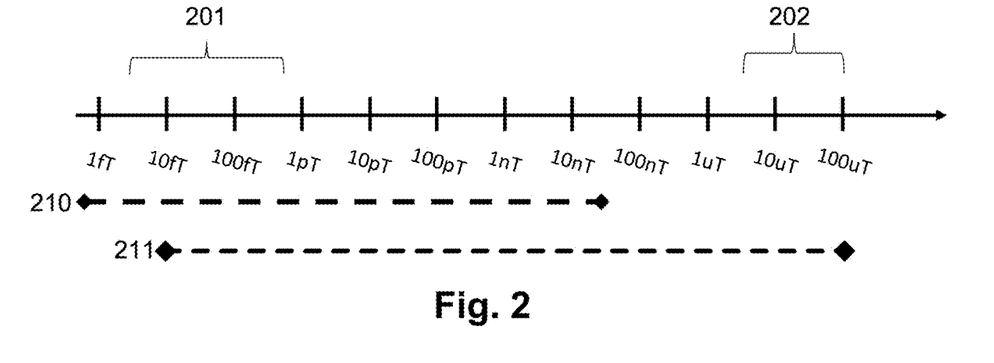
FIG. 2 shows a magnetic spectrum with lines indicating dynamic ranges of magnetometers operating in different modes.

FIG. 2 shows the magnetic spectrum from 1 fT to 100 µT in magnetic field strength on a logarithmic scale. The magnitude of magnetic fields generated by the human brain are indicated by range 201 and the magnitude of the background ambient magnetic field, including the Earth's magnetic field, by range 202. The strength of the Earth's magnetic field covers a range as it depends on the position on the Earth as well as the materials of the surrounding environment where the magnetic field is measured. Range 210 indicates the approximate measurement range of a magnetometer operating in the SERF mode (e.g., a SERF magnetometer) and range 211 indicates the approximate measurement range of a magnetometer operating in a scalar mode (e.g., a scalar magnetometer.) Typically, a SERF magnetometer is more sensitive than a scalar magnetometer but many conventional SERF magnetometers typically only operate up to about 0 to 200 nT while the scalar magnetometer starts in the 10 to 100 fT range but extends above 10 to 100 µT.

SERF OPMs can achieve femto-Tesla/Hz$^{1/2}$ sensitivities and can detect magnetoencephalography (MEG). In these OPMs the rate of spin-exchange collisions $R_{se}$ among alkali metal atoms, which typically introduce decoherence, is much faster than the Larmor precession rate $\omega_0 = \gamma |B|$, where $\gamma$ is the gyromagnetic ratio of the atom and $|B|$ is the strength of the magnetic field. In at least some embodiments, the spin-exchange collision rate can be expressed as $R_{se} = \sigma_{se} v n_{A1}$, where, as an example, the cross-section for SE collisions $\sigma_{se} = 2 \times 10^{-14}$ cm$^2$, the relative thermal speed of two colliding alkali metal atoms $v \sim 10^4$ cm/s at the temperature of 150° C., and $n_{A1}$ denoting the alkali metal vapor density. In at least some embodiments, SERF is achieved when $R_{se}>10\omega_0$, which can occur, for example, at low magnetic fields $B_0$ and large alkali metal vapor densities. Accordingly, SERF OPMs have conventionally included a rigid, large magnetic shield enclosure (often using mu-metal) to reduce the Earth's magnetic field by a factor of at least 1000× to reliably achieve the SERF mode. However, the size, rigidity, and cost of this conventional magnetic shielding may make the use of these systems prohibitive for many applications.

In contrast to these conventional arrangements, systems, arrangements, devices, and methods, as disclosed herein, can utilize a ferrofluid to produce shielding, beamforming, or any combination thereof. In at least some embodiments, the ferrofluid is part of a microfluidic or MEMS (or both) system or arrangement (which may be disposed within, or form, a soft or hard substrate) to control the shape and distribution of the ferrofluid in a static or dynamic (or both static and dynamic) configuration.

A ferrofluid is a liquid that becomes strongly magnetized in the presence of a magnetic field. Examples of suitable ferrofluids include, but are not limited to, colloidal solutions of particles (in at least some embodiments, nanoscale particles) of magnetite, hematite, other iron-containing compounds, or other magnetic compounds, or any combination thereof. The particles are dispersed in a liquid carrier, such as water, mineral oil, hydrocarbon fluids, or other fluids. In at least some embodiments, the ferrofluid also includes a surfactant to facilitate dispersal of the particles in the fluid.

In at least some embodiments, the systems, arrangements, devices, and methods disclosed herein can be used in MEG systems (including compact MEG systems) or other magnetic field measurement systems to produce, at least in some embodiments, a compact, foldable, or conformal magnetic shield that could be used to shield the OPM from external magnetic fields. In at least some embodiments, the systems, arrangements, devices, and methods disclosed herein can be used in MEG systems or other magnetic field measurement systems to achieve any combination of dynamic magnetic field routing or beamforming to, for example, enhance the magnetic signal produced by a magnetic field source (such as neurons) versus the ambient background magnetic field produced by external noise (for example, the Earth's magnetic field, magnetic fields from external magnets, electromagnets, and other electrical devices) and, at least in some embodiments, irrelevant brain activity.

In at least some embodiments, the systems, arrangements, devices, and methods disclosed herein can include flexible or conformal magnetic shielding that includes a ferrofluid. For many applications, including compact MEG systems, it is desirable to have a magnetic shield that can be easily folded (i.e. flexible) or be conformal (i.e. can conform to a desired shape—for example the human head). In contrast, conventional magnetic shields are often based on metals with high permeability (e.g. Mu-metal), which are generally rigid and non-conformal.

In at least some embodiments, the ferrofluid is used to redirect or concentrate magnetic fields (for example, the ambient background magnetic field or biological magnetic fields) within a given region of space to improve the sensitivity of SERF OPMs. In at least some embodiments, the ferrofluid can also be used in conjunction with scalar OPMs or to detect MEG.

Figure 3A:
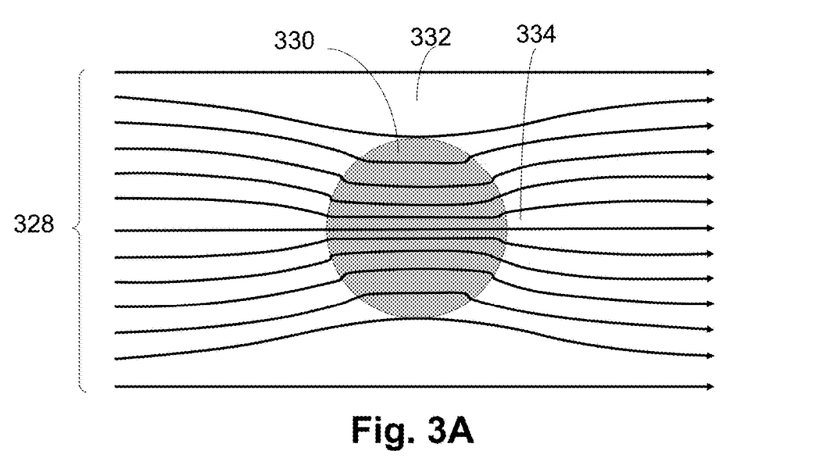
FIG. 3A is a schematic view of magnetic field lines interacting with a sphere of ferrofluid.
Figure 3B:
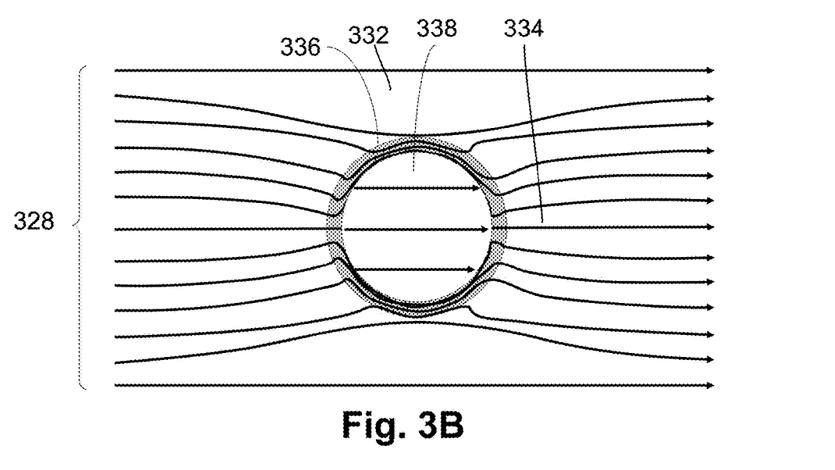
FIG. 3B is a schematic view of magnetic field lines interacting with a hollow sphere of ferrofluid.

The ferrofluids can be utilized for magnetic field routing and beamforming. The spatial and temporal distribution of the ferrofluid around the OPM can be designed to increase or maximize the intensity of magnetic fields originating from locations of interest, for example within the user's brain, while reducing or minimizing the effect of fields originated from locations that produce interference or unwanted fields (e.g. Earth field, electric lines, electrical devices, or the like). FIGS. 3A and 3B illustrate the concentration of magnetic field lines using a ferrofluid to produce magnetically shielded areas. The ferrofluid can be statically or dynamically arranged, as described above, to produce areas, such as areas that contain the OPM(s), that are magnetically shielded by the ferrofluid from the ambient background magnetic field, while maintaining or enhancing the magnetic field of interest such as the ones produced from neural activity. For example, in a magnetic field measurement system that takes the form of a helmet, cap, hood, or the like to fit on the head of a user, the ferrofluid can be arranged to create magnetically shielded areas that contain the OPMs of the magnetic field measurement system to reduce or eliminate the ambient background magnetic field at the OPMs. In at least some embodiments, the distribution and flow of the ferrofluid can be controlled by one or more processors. In at least some embodiments, the processor can implement machine learning control or model predictive control to produce or modify the distribution and flow of the ferrofluid in order to configure the ferrofluid into shielding or beamforming structures in a dynamic or static manner.

FIG. 3A illustrates magnetic field lines 328 interacting with a region 330 containing a ferrofluid. The field lines are bent into the material and flow through the region 330 leaving magnetically shielded areas 332 adjacent to the region 330 as well as an area 334 of increased field strength. In field line plots, the closer the magnetic field lines, the stronger the field in the region. Conversely, the further apart the field lines, the weaker the field.

FIG. 3B illustrates magnetic field lines 328 interacting with a hollow sphere 336. This arrangement results in similar magnetically shielded regions 332 and regions of increased field strength 334, but also results in a magnetically shielded region 338 inside the hollow sphere 336.

Figure 4:
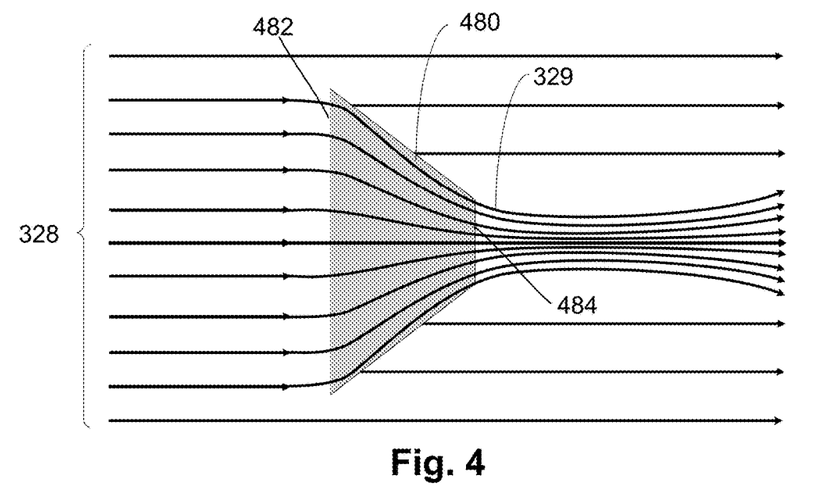
FIG. 4 is a schematic view of magnetic field lines interacting with a ferrofluid flux concentrator.

Ferrofluids can also be used to generate flux concentrators that use magnetic field routing and beamforming to direct magnetic fields, such as those arising from the brain or other biological or nonbiological sources, toward one or more OPMs. FIG. 4 illustrates one embodiment of a flux concentrator 480 formed using a ferrofluid to direct (for example, to squeeze) some of the magnetic field lines 328 into a tighter, or more concentrated, region 329. This arrangement is considered to concentrate the magnetic field signals so that the magnetic flux density is larger at the exit end 484 of the flux concentrator 480 than at the entry end 482. In the illustrated example of FIG. 4, the source of the magnetic field lines 328 is to the left and some of the magnetic field lines are concentrated into region 329 as the magnetic field lines passes through the shaped flux concentrator 480. The ferrofluid flux concentrator 480 can be used to concentrate, boost, amplify, or redirect the magnetic field signal from a certain region, such as the brain. The flux concentrator may also concentrate, boost, amplify, or redirect unwanted magnetic field signals from the environment (i.e., the ambient background magnetic field) and, therefore, may be used in conjunction with other passive or active shielding (such as a ferrofluid shield) to reduce or eliminate the ambient background magnetic field.

FIG. 4 illustrates one embodiment of a flux concentrator. The flux concentrator 480 has a trapezoidal or triangular cross-sectional shape in which the entry end 482 has a larger width, length, or surface area than the exit end 484. At the exit end 484, the magnetic field signal (or magnetic flux) is significantly increased by the redirection or concentration of the magnetic field lines by the flux concentrator 480. In three dimensions, the flux concentrator 480 may have a conical shape or a pyramidal shape with three or four sides extending from a base, or any other suitable three-dimensional shape A flux concentrator 480 can have any other suitable shape that provides a desired redirection of the magnetic field lines. Accordingly, a flux concentrator can be considered to also be a flux shaper.

Other properties of ferrofluids can also be used in the systems, arrangements, devices, and methods disclosed herein. For example, the frequency response of ferrofluids can be used to block low-frequency magnetic fields (such as, for example, the Earth's magnetic field), while transmitting high frequencies of interest (i.e. neural signals). This can be facilitated by selection of the nanoparticle size, the operating temperature, the liquid hosting the nanoparticles, the surface chemical termination of the nanoparticles, the surfactant used with the nanoparticles, and the like. The thermal response, pH response (due to the change in surface chemistry—for example, to), or the like can also be used to dynamically change the properties of the ferrofluid.

In at least some embodiments, the frequency response of the ferrofluid, x(w), can be modeled as:

$$\chi(\omega) = \frac{\chi_{sp} + i\omega\tau\chi_b}{1 + i\omega\tau}$$

where $\omega/2\pi$ is the frequency of the applied field;

$$\chi_{sp} = \frac{n\mu_0\mu^2}{3k_BT}$$

is the susceptibility of the ferrofluid in the superparamagnetic state;

$$\chi_b = \frac{n\mu_0\mu^2}{3KV}$$

is the susceptibility of the ferrofluid in the blocked state; and $$\tau = \frac{\tau_N}{2}$$

is the relaxation time of the assembly;

$$\tau_N = \tau_0 \exp\left(\frac{KV}{k_BT}\right)$$

where $\tau_N$ is the average length of time that it takes for the nanoparticle's magnetism to randomly flip as a result of thermal fluctuations; $\tau_0$ is a length of time, characteristic of the material, called the "attempt time" or "attempt period" (its reciprocal is called the "attempt frequency"); its typical value is between $10^{-9}$ and $10^{-10}$ seconds; K is the nanoparticle's magnetic anisotropy energy density; V is the nanoparticle's volume; KV is the energy barrier associated with the magnetization moving from its initial easy axis direction, through a "hard plane", to the other easy axis direction; kB is the Boltzmann constant; T is the temperature; n is the density of the nanoparticle in the sample; $\mu_0$ is the magnetic permeability of vacuum; and $\mu$ is the magnetic moment of a nanoparticle. The time response of magnetization M to a magnetizing field H (at low field) is governed by:

$$\tau\frac{dM}{dt} + M = \tau\chi_b\frac{dH}{dt} + \chi_{sp}H$$

Figure 5:
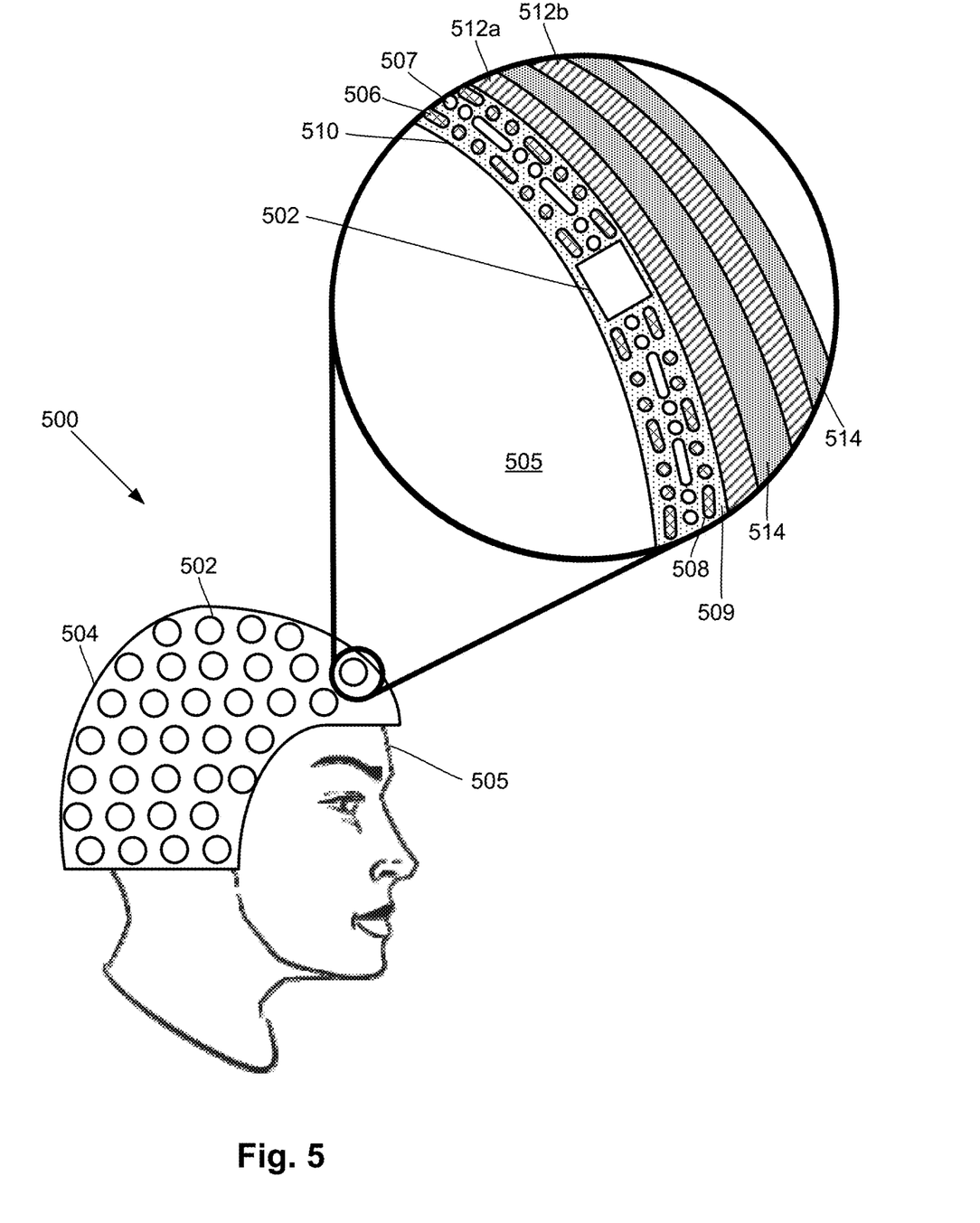
FIG. 5 is a schematic side view of one embodiment of a magnetic field measurement system with magnetometers in a wearable article, as well as an expanded cross-sectional view of the wearable article with a microfluidic ferrofluid shield, according to the invention.

FIG. 5 illustrates one embodiment of some components of a magnetic field measurement system 500 (for example, a MEG system) with multiple OPMs 502 or other magnetic field sensors arranged in wearable article 504 (for example, a helmet, cap, hat, hood, scarf, wrap, or other headgear or the like) that can fit on the head of a user 505. The OPMs 502 or other magnetic field sensors can be shielded by (for example, embedded in) a microfluid fabric 509 that includes a ferrofluid 506 disposed in microfluid channels 508 and forms a microfluidic ferrofluid shield 510. The microfluid fabric 509 is used as an example of a substrate or layer of material that contains microfluid channels within which the ferrofluid 506 is disposed or flowable into. It will be recognized that substrate or layers other than fabric can be used including, but not limited to, plastic or polymer substrate or layers (and particularly flexible or conformal plastics or polymers.)

The arrangement of the microfluid channels 508 and distribution of the ferrofluid 506 in the microfluid channels can provide shielding, one or more flux concentrators, or any combination thereof. In at least some embodiments, the distribution of the ferrofluid 506 can be static. In other embodiments, the magnetic field measurement system 500 can dynamically alter the distribution or flow of the ferrofluid 506 within the microfluid channels 508 to alter the magnetic field response. For example, the magnetic field measurement system 500 may dynamically alter the distribution or flow of the ferrofluid 506 in response to changes in the ambient background magnetic field or as the user's head moves (thereby reorienting the OPMs with respect to the ambient background magnetic field.) As another example, the magnetic field measurement system 500 may dynamically alter the distribution or flow of the ferrofluid 506 to generate one or more flux concentrators to shift the concentration of magnetic flux from one region of the brain to another.

In at least some embodiments, to alter or determine the distribution of the ferrofluid 506 within the microfluid channels 508, pressure fluid channels 507 are distributed within the microfluid fabric 509. As described below, the pressure fluid channels can operate as valves to alter the flow and distribution of the ferrofluid 506 in the microfluid channels 508. As an alternative to pressure fluid channels, electrostatic valves or other suitable valves can be used. As yet other alternative, magnetically or electrically driven ferrofluid arrangements can be used.

The wearable article 504 can optionally include additional shields 512a, 512b, such as ferrofluid shields, may also be provided for further shielding. These additional shields 512a, 512b can also be microfluidic ferrofluid shields or can be a static layer of ferrofluid or other shielding material such as Mu-metal or Metglas (for example, Metglas™ 2705 or Metglas™ 2714 (available from Metglas, Inc., Conway, S.C., USA) or Vitrovac™ 6025 X (available from Sekels GmbH, Ober-Moerlen, Germany)). Optionally, one or more layers 514 of support material, such as plastic, fabric, metal, aerogel, or the like or any combination thereof, can be provided for structure to the wearable article 504.

In at least some embodiments, the systems, arrangements, devices, and methods disclosed herein can provide flexible or conformal magnetic shielding. In at least some embodiments, the ferrofluid is placed within a thin, flexible, and stretchable substrate (such as the microfluid fabric 508) to form a flexible or conformal magnetic shield. The microfluidic ferrofluid shield 510 or the wearable article 504 described herein can have any combination of the following properties: compact, flexible, conformal, and enhancement of the MEG signal-to-noise ratio.

Figure 6:
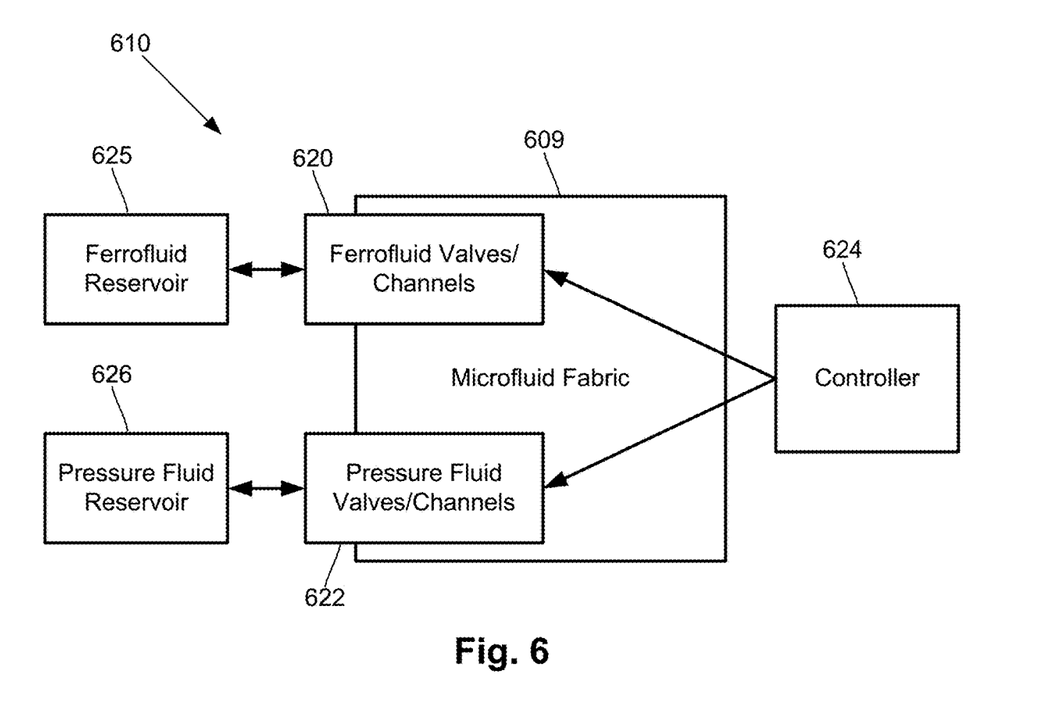
FIG. 6 is a schematic block diagram of one embodiment of selected components of a microfluidic ferrofluid shield, according to the invention.

FIG. 6 illustrates components of one embodiment of a microfluidic ferrofluid shield 610 including the microfluid fabric 609, one or more ferrofluid valves and channels 620 (including, for example, the microfluid channels 508 of FIG. 5), one or more pressure fluid valves and channels 622 (including, for example, the pressure fluid channels 507 of FIG. 5), and a microfluid controller 624 (which can be, but is not necessarily, the computer device 150 of the magnetic field measurement system 140 of FIG. 1A). In at least some embodiments, one or more of the ferrofluid valves/channels 620 or one or more of the pressure fluid valves/channels 622 is disposed outside of the microfluid fabric 609, but the majority (or all) of these valves/channels 620/622 are disposed within or on the microfluid fabric to control the placement and flow of the ferrofluid within the microfluid fabric. The term "microfluid" is often used in microfabricated fluid systems; however, it will be understood that arrangements with larger channels (for example, mm-scale and cm-scale channels) can be used.

In at least some embodiments, the term "fabric" refers to a flexible or conformal structure that is made of a mix of dissimilar elongated material that are connected to each other via adhesives or woven together (or any combination thereof) and is not necessarily restricted to conventional fabrics, such as fibers of plastic, cotton, or the like. In at least some embodiments, the term "microfluid fabric" refers to a wearable structure that is made with microfluidic components. The microfluid fabric 609 can be formed of any suitable polymer, fabric material, or the like or any combination thereof.

In at least some embodiments, the ferrofluid is stored in at least one ferrofluid reservoir 625 and a pressure fluid is stored in at least one pressure fluid reservoir 626. In at least some embodiments, the microfluidic ferrofluid shield 610 is designed such that the ferrofluid can be moved back and forth to and from the at least one ferrofluid reservoir 625. In at least some of these embodiments, this movement can shift the microfluidic ferrofluid shield 610 between an operation mode and a storage mode.

The pressure fluid can be used to pressurize the ferrofluid for delivery of the ferrofluid through the ferrofluid valves and channels 622. The pressure fluid may also be used to operate valves that control the distribution and flow of the ferrofluid. The pressure fluid is preferably a non-magnetic (for example, having a very small magnetic susceptibility) liquid or gas, such as nitrogen, air, water, or the like or any combination thereof.

The ferrofluid is channeled through the microfluid fabric 609 in the locations of interest using a microfluid valving system that includes the ferrofluid valves/channels 620 and pressure fluid valves/channels 622. One example of a microfluid valving system is a crossbar configuration, where the non-magnetic pressure fluid in the pressure fluid valves/channels 622 can inflate a zone crossing a ferrofluid channel 506 (FIG. 5) and, acting as a valve, halts the flow of the ferrofluid through the ferrofluid channel 506. Using the microfluid valving system, the controller 624 can distribute ferrofluid into an arrangement within the microfluid fabric 609 that provides either i) the desired magnetic field shielding for the ambient background magnetic field or ii) one or more flux concentrators to concentrate magnetic field lines from the magnetic field source of interest into the OPM 502 (FIG. 5) or any combination of shielding and flux concentrator(s).

As an alternative to the use of a pressure fluid for operating the valves, any other suitable technology with small magnetic field generation and low susceptibility material can also be used for the valves to produce dynamic switching. For example, electrostatic valves (similar to MEMS technologies) can also be used. As another an alternative to microfluidic and MEMS techniques for managing the ferrofluid, magnetically driven ferrofluids can be used and, at least in some embodiments, AC magnetic fields may be used to reduce interference. Yet another alternative is electrically driven ferrofluids. Many ferrofluids are highly insulating and have a reasonably large permittivity. Such ferrofluids could be used in conjunction with electrodes that can produce local electric fields to drive and control the position and flow of the ferrofluids within the channels.

Accordingly, in at least some embodiments, the systems (for example, the magnetic field measurement system 500 of FIG. 5), arrangements, devices, and methods disclosed herein can include dynamic magnetic field routing and beamforming using, for example, the arrangements of ferrofluids illustrated in FIGS. 3A, 3B, and 4 to redirect or concentrate the magnetic field. In at least some embodiments, as described above the ferrofluid is shaped within a microfluidic or MEMS arrangement such that the magnetic fields produced by brain neural activities with a specific location distribution are enhanced, increased, or maximized at a desired location outside the tissue using, for example, the flux concentrator 480 of FIG. 4. Such "structural beamforming" can be particularly useful in MEG applications, where the number and location of magnetic sensors, such as OPMs, may not be easily changeable, to enhance the magnetic field produced from a given neural activity (or other magnetic field source). Thus, the desired magnetic field can be enhanced, increased, or maximized at one or more magnetic sensor (for example, OPM) location(s) while, in at least some embodiments, the effect of the field produced by activities in other locations may be reduced or suppressed. Algorithms can be used to select, generate, enhance, or optimize the shape or arrangement of the ferrofluid dynamically. In at least some embodiments, such algorithms may include, or be modified, by machine learning control or model predictive control techniques or methods.

The above specification provides a description of the invention and its manufacture and use. Since many embodiments of the invention can be made without departing from the spirit and scope of the invention, the invention also resides in the claims hereinafter appended.

What is claimed as new and desired to be protected by Letters Patent of the United States is:

1. A magnetic field measurement system, comprising:
   at least one magnetometer; and
   a ferrofluid shield disposed at least partially around the at least one magnetometer, the ferrofluid shield comprising a microfluid fabric and a ferrofluid disposed in or flowable into the microfluid fabric.

2. The magnetic field measurement system of claim 1, wherein the microfluid fabric comprises a plurality of ferrofluid channels extending through the microfluid fabric.

3. The magnetic field measurement system of claim 1, wherein the ferrofluid shield further comprises a ferrofluid reservoir in fluid communication with the microfluid fabric and configured to hold at least a portion of the ferrofluid.

4. The magnetic field measurement system of claim 1, wherein the ferrofluid shield further comprises a pressure fluid disposed in or flowable into the microfluid fabric and configured to facilitate flow or disposition of the ferrofluid within the microfluid fabric.

5. The magnetic field measurement system of claim 4, wherein the ferrofluid shield further comprises a pressure fluid reservoir in fluid communication with the microfluid fabric and configured to hold at least a portion of the pressure fluid.

6. The magnetic field measurement system of claim 4, wherein the ferrofluid shield further comprises a plurality of ferrofluid channels extending through the microfluid fabric and a plurality of pressure fluid channels extending through the microfluid fabric.

7. The magnetic field measurement system of claim 6, wherein the ferrofluid channels and pressure fluid channels are arranged so that the pressure fluid can operated as valves at positions along the ferrofluid channels.

8. The magnetic field measurement system of claim 4, wherein the ferrofluid shield further comprises a controller configured to alter disposition of the ferrofluid within the microfluid fabric using the pressure fluid.

9. The magnetic field measurement system of claim 1, wherein the system comprises a plurality of the magnetometers and the ferrofluid shield and the magnetometers are arranged as part of a helmet, cap, hat, hood, scarf, wrap, or other headgear.

10. The magnetic field measurement system of claim 1, wherein the ferrofluid shield is configured to generate at least one flux concentrator using the ferrofluid to concentrate magnetic field lines from a magnetic field source towards the at least one magnetometer.

11. A magnetic field measurement system, comprising:
at least one magnetometer; and
a ferrofluid shield disposed at least partially around the at least one magnetometer, the ferrofluid shield comprising a ferrofluid and a controller configured to alter an arrangement of the ferrofluid within the ferrofluid shield.

12. The magnetic field measurement system of claim 11, wherein the ferrofluid shield further comprises a layer having one or more ferrofluid channels extending through the layer, wherein the ferrofluid is disposed within or flowable into the one or more ferrofluid channels.

13. The magnetic field measurement system of claim 11, wherein the ferrofluid shield further comprises a ferrofluid reservoir configured to hold at least a portion of the ferrofluid.

14. The magnetic field measurement system of claim 11, wherein the ferrofluid shield further comprises a pressure fluid configured to facilitate flow or disposition of the ferrofluid within the ferrofluid shield.

15. The magnetic field measurement system of claim 14, wherein the ferrofluid shield further comprises a pressure fluid reservoir configured to hold at least a portion of the pressure fluid.

16. The magnetic field measurement system of claim 14, wherein the ferrofluid shield further comprises a layer having one or more ferrofluid channels and one or more pressure channels extending through the layer.

17. The magnetic field measurement system of claim 16, wherein the ferrofluid channels and pressure fluid channels are arranged so that the pressure fluid can operated as valves at positions along the ferrofluid channels.

18. The magnetic field measurement system of claim 14, wherein the controller is configured to alter the arrangement of the ferrofluid within the ferrofluid shield using the pressure fluid.

19. The magnetic field measurement system of claim 11, wherein the system comprises a plurality of the magnetometers and the ferrofluid shield and the magnetometers are arranged as part of a helmet, cap, hat, hood, scarf, wrap, or other headgear.

20. The magnetic field measurement system of claim 11, wherein the ferrofluid shield is configured to generate at least one flux concentrator using the ferrofluid to concentrate magnetic field lines from a magnetic field source towards the at least one magnetometer.

* * * * *